United States Patent
Kwon et al.

(10) Patent No.: US 7,385,260 B2
(45) Date of Patent: Jun. 10, 2008

(54) SEMICONDUCTOR DEVICE HAVING SILICIDE THIN FILM AND METHOD OF FORMING THE SAME

(75) Inventors: Hyung-Shin Kwon, Kyunggi-do (KR); Joon-Yong Joo, Seoul (KR); Kwang-Ok Koh, Kyunggi-do (KR); Sung-Bong Kim, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/830,390

(22) Filed: Apr. 21, 2004

(65) Prior Publication Data

US 2004/0198032 A1    Oct. 7, 2004

Related U.S. Application Data

(62) Division of application No. 10/100,929, filed on Mar. 18, 2002, now Pat. No. 6,767,814.

(30) Foreign Application Priority Data

Mar. 19, 2001 (KR) .............................. 2001-14004

(51) Int. Cl.
*H01L 29/861* (2006.01)
(52) U.S. Cl. .................. 257/383; 257/384; 257/770
(58) Field of Classification Search ............. 257/383, 257/384, 770
See application file for complete search history.

(56) References Cited

U.S. PATENT DOCUMENTS

| | | | |
|---|---|---|---|
| 5,672,544 A * | 9/1997 | Pan | 438/305 |
| 5,736,461 A | 4/1998 | Berti et al. | |
| 5,780,362 A | 7/1998 | Wang et al. | |
| 5,789,298 A | 8/1998 | Gardner et al. | |
| 5,899,720 A * | 5/1999 | Mikagi | 438/303 |
| 5,902,129 A | 5/1999 | Yoshikawa et al. | |
| 5,970,370 A * | 10/1999 | Besser et al. | 438/586 |
| 5,973,372 A * | 10/1999 | Omid-Zohoor et al. | 257/383 |
| 6,004,853 A | 12/1999 | Yang et al. | |

(Continued)

FOREIGN PATENT DOCUMENTS

JP    11-195619    7/1999

(Continued)

OTHER PUBLICATIONS

K. Inoue et al, A New Cobalt Salicide Technology For 0.15 micron CMOS Using High-Temperature Sputtering and In-situ Vacuum Annealing, Dec. 10-13, 1995 International Eletron Devices Metting.

*Primary Examiner*—Long Pham
(74) *Attorney, Agent, or Firm*—Marger, Johnson & McCollom, P.C.

(57) ABSTRACT

The present invention provides a semiconductor device having a silicide thin film and method of forming the same. A semiconductor device comprises a gate insulation layer formed on an active region of a semiconductor substrate. A gate electrode is formed on the gate insulation layer. An impurity region is formed in the active region adjacent the gate electrode. A silicide thin film such as a cobalt silicide thin film is formed to a thickness of less than approximately 200 Å in the impurity region.

15 Claims, 7 Drawing Sheets

U.S. PATENT DOCUMENTS

| | | | |
|---|---|---|---|
| 6,008,111 A | 12/1999 | Fushida et al. | |
| 6,121,098 A * | 9/2000 | Strobl | 438/301 |
| 6,124,178 A * | 9/2000 | Sung et al. | 438/308 |
| 6,150,243 A * | 11/2000 | Wieczorek et al. | 438/558 |
| 6,171,959 B1 | 1/2001 | Nagabushnam | |
| 6,180,501 B1 | 1/2001 | Pey et al. | |
| 6,197,646 B1 | 3/2001 | Goto et al. | |
| 6,284,662 B1 * | 9/2001 | Mikagi | 438/706 |
| 6,287,913 B1 | 9/2001 | Agnello et al. | |
| 6,291,354 B1 | 9/2001 | Hsiao et al. | |
| 6,297,148 B1 | 10/2001 | Besser et al. | |
| 6,335,249 B1 | 1/2002 | Thei et al. | |
| 6,340,617 B1 | 1/2002 | Goto | |
| 6,346,477 B1 | 2/2002 | Kaloyeros et al. | |
| 6,376,320 B1 | 4/2002 | Yu | |
| 6,388,327 B1 | 5/2002 | Giewont et al. | |
| 6,399,467 B1 * | 6/2002 | Erhardt et al. | 438/592 |
| 6,406,986 B1 | 6/2002 | Yu | |
| 6,461,951 B1 | 10/2002 | Besser et al. | |
| 6,630,721 B1 * | 10/2003 | Ligon | 257/413 |
| 2001/0001297 A1 | 5/2001 | Wang et al. | |
| 2002/0064919 A1 | 5/2002 | Wang | |
| 2002/0086486 A1 | 7/2002 | Tanaka et al. | |

FOREIGN PATENT DOCUMENTS

| | | |
|---|---|---|
| KR | 1997-0067719 | 10/1997 |

* cited by examiner

SEMICONDUCTOR DEVICE HAVING SILICIDE THIN FILM AND METHOD OF FORMING THE SAME

This application is a divisional of U.S. patent application Ser. No. 10/100,929, filed Mar. 18, 2002, now U.S. Pat. No 6,767,814, which is herein incorporated by reference in its entirety.

BACKGROUND OF THE INVENTION

1. Field of the Invention

The present invention relates to a semiconductor device and method of forming the same, and more particularly to a semiconductor device having a silicide thin film and method of forming the same.

2. Description of the Related Art

Silicon generally has the properties of semiconductor, but acts as a conductor when impurities are implanted into it, as is the case when used in a semiconductor device. In addition, silicon and metal can be easily transformed into a metal silicide having high conductivity. Accordingly, in a highly-integrated semiconductor device in which resistance increases as the width of a conductive line such as a gate line and contact sizes are reduced, metal silicide is often used to form a portion of a contact interface or a signal line such as the gate line to enhance the conductivity and the performance of the device.

Also, as semiconductor devices are scaled down, the junction depths of source/drain regions are also reduced. To reduce the contact resistance of the source/drain regions, metal silicide can again be used. At this time, a layer of metal silicide is generally formed to a thickness of several hundred angstroms (Å). However, for example, when the metal silicide layer having a thickness of 300 Å is formed on the source/drain regions having a thin junction depth of 1000 Å, the metal silicide layer may be directly connected to the substrate beyond the source/drain regions. Consequently, various problems, such as a junction spiking phenomenon generating a leakage current, can occur. This junction spiking phenomenon is similar to the spiking problem in which the signal current leaks into the substrate when aluminum contact plugs are connected to the source/drain regions.

Cobalt or titanium (Ti) metals, having a low contact interface resistance, are commonly used to form the metal silicide layer. With cobalt, however, the probability of encountering the junction spiking phenomenon is increased. The cobalt silicide layer is usually formed by coating a cobalt layer on the exposed surface of a substrate through sputtering. Sputtering is followed by a two-step heat treatment, in which a first step takes place at temperatures of 500 to 600° C. and a second step takes place at more than 750° C., or a one-step heat treatment that takes place at a high temperature of more than 750° C. The heat treatment silicifies the cobalt layer. After the heat treatment, non-reacted portions of the cobalt layer are removed in a self-aligned manner by wet etching. Using this technique, it is difficult to control a speed of forming the cobalt silicide layer to form a thin layer. When the cobalt silicide layer is formed, the polysilicon layer and the cobalt layer are usually combined in a ratio of 360 Å to 100 Å. It is further difficult to coat the cobalt layer uniformly at a thickness of less than 80 Å through sputtering and to re-form it repeatedly. The reliability of fabrication process is therefore deteriorated. Thus, forming the cobalt silicide layer of less than 300 Å, as well as preventing the junction spiking phenomenon in the source/drain regions having the thin conjunction depth, is difficult.

When the signal current leaks into the substrate without being transmitted through channels, the consumption of the signal current is increased and the operation speed of transistors slows. Worst yet, the transistors may not operate properly. Particularly, in a low power SRAM device, it is necessary to prevent the generation of leakage current to obtain reliable operation of the device.

To prevent the spiking phenomenon that results from using the cobalt silicide layer, a titanium silicide layer ($TiSi_2$) in the source/drain regions can be formed using titanium to reduce the spiking phenomenon. In this case, however, because titanium exhibits an amount of resistance that depends on the line width, the resistance is abruptly increased in most semiconductor devices having a line width of less than 0.2 μm. Also, the resistance characteristics of the titanium may be degraded following heat treatment.

SUMMARY OF THE INVENTION

According to an aspect of the present invention, a semiconductor device comprises a gate insulation layer formed on an active region of a semiconductor substrate. A gate electrode is formed on the gate insulation layer. An impurity region such as a source/drain region is formed in the active region adjacent the gate electrode. A silicide thin film is formed to a thickness of less than approximately 200 Å in the impurity region.

According to another aspect of the present invention, there is provided a method of forming a semiconductor device comprising forming an isolation layer on a surface of a substrate to define an active region, forming at least one gate electrode by sequentially forming a gate insulation layer and a gate layer on the surface of the substrate in the active region and patterning them to expose source/drain regions, forming a metal layer such as a cobalt layer on the surface of the substrate in the exposed source/drain region, forming a low temperature type silicide thin film such as a cobalt silicide thin film by performing a heat treatment at a low temperature of 150 to 450° C., preferably 300 to 400° C. to the substrate on which the cobalt layer is formed, removing non-reacted portions of the cobalt layer from the substrate on which the low temperature type cobalt silicide thin film is formed, and forming a high temperature type metal silicide thin film such as a high temperature type cobalt silicide thin film by performing a heat treatment at a high temperature of more than 700° C., preferably 850° C. to the low temperature type silicide thin film.

In the invention, because the heat treatment after forming the cobalt layer is carried out at a low temperature, it is desirable that the low temperature type cobalt silicide thin film be formed in an in-situ method in a sputtering device after the sputtering. Also, instead of the cobalt layer, a layer of metal such as nickel, titanium and platinum can be used.

BRIEF DESCRIPTION OF THE DRAWINGS

The foregoing and other objects, features and advantages of the invention will become more apparent from the following detailed description of preferred embodiments thereof made with reference to the attached drawings, of which.

DETAILED DESCRIPTION OF PREFERRED EMBODIMENTS

The present invention now will be described more fully hereinafter with reference to the accompanying drawings, in which preferred embodiments of the invention are shown. Like numbers refer to like elements throughout.

FIG. 1 to FIG. 7 are flow diagrams showing various stages of processing steps for forming a semiconductor device in accordance with an embodiment of the present invention.

Figure 1:
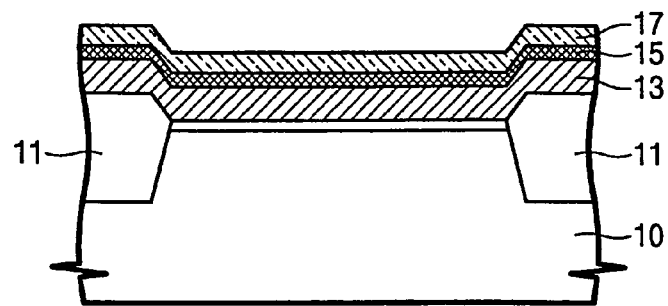
FIG. 1 and FIG. 7 are flow diagrams showing various stages of processing steps for forming a semiconductor device in accordance with an embodiment of the present invention.

Referring now to FIG. 1, an isolation trench 11 is formed on a semiconductor substrate 10 to define an active region therein. A gate insulation layer is then formed on the semiconductor substrate 10 in the active region by thermal oxidation. Then, a polysilicon layer 13, a tungsten silicide layer 15, and a silicon oxynitride layer for forming an anti-reflection layer 17 are sequentially deposited to form a gate structure by chemical vapor deposition (CVD). The anti-reflection layer 17 may be a middle temperature oxide (MTO) layer, a high temperature oxide (HTO) layer or a silicon nitride layer instead of the silicon oxynitride layer. The anti-reflection layer 17 lessens the reactions between the layers disposed thereunder and a cobalt layer during the following process, such as forming the cobalt layer or performing a heat treatment at low temperatures. The tungsten silicide layer 15 reduces the resistance to the signal transmission of the gate lines. The tungsten silicide layer 15 can be formed to a thickness of several hundred angstroms Å because it is formed separately from a cobalt silicide layer to be later formed in source/drain regions.

Figure 2:
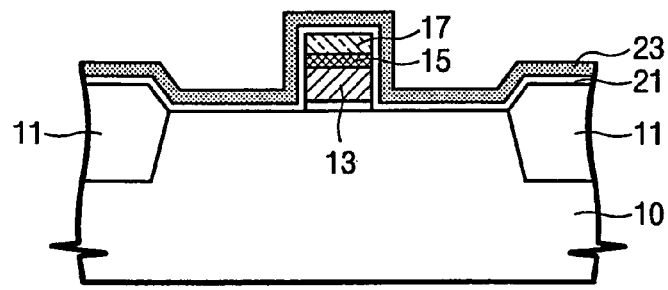

Referring to FIG. 2, the gate layer 13, 15, 17 is patterned to form a gate pattern. That is, a photo-resist pattern is formed on the gate layer 13, 15, 17 using conventional techniques. Then, the exposed gate layer is etched to form a gate pattern using the photo-resist pattern as an etch mask. To form spacers, a MTO layer 21 and a silicon nitride layer 23 are formed on the resulting structure including the gate pattern by conventional techniques such as CVD.

Figure 3:
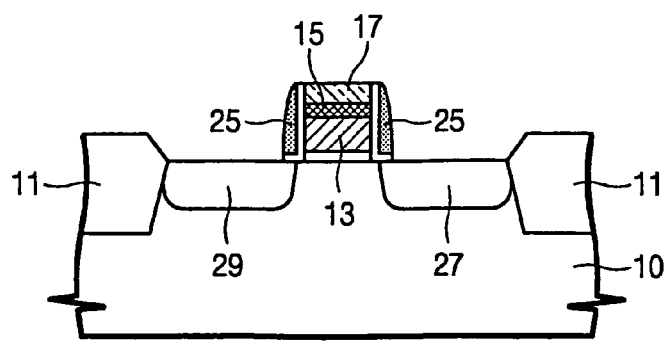

Referring to FIG. 3, the MTO layer 21 and the silicon nitride layer 23 are anisotropically etched. As a result, insulation spacers 25 are formed on sidewalls of the gate pattern. At this time, an inner layer of the insulation spacers 25 adjacent to the gate pattern is the MTO layer and an outer layer thereof is the silicon nitride layer. Then, an ion implantation process is carried out using the gate pattern and the spacers 25 as a mask to form source/drain regions 27, 29 in the substrate 10. To form source/drain regions 27, 29 having lightly-doped drain (LDD) structures, the substrate 10 is lightly doped before forming the spacers 25 and heavily doped after forming the spacers 25. As semiconductor devices become highly integrated, the width of the active region defined by the isolation layer 11 and the width and the junction depth of the source/drain regions 27, 29 are also reduced. In this embodiment, the junction depth is within a range of 1000 to 1300 Å.

Figure 4:
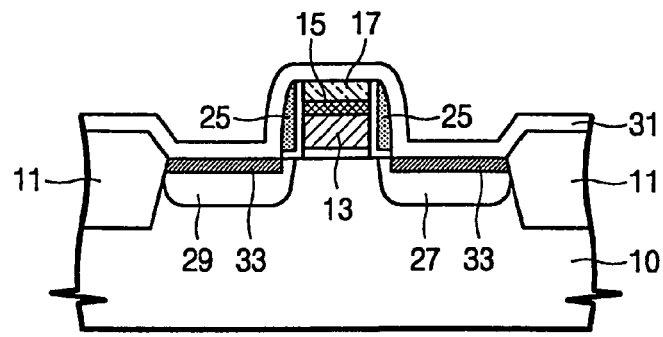

Referring to FIG. 4, a cobalt layer 31 is coated on the resulting structure including the gate pattern and the source/drain regions 27, 29. The coating of the cobalt layer 31 is generally carried out by conventional techniques such as sputtering. A heat treatment is then carried out at a low temperature of 300° C. to form a cobalt silicide thin film or layer 33. Since the heat treatment can be carried out at a temperature of 150 to 450° C., it is desirable that the heat treatment be carried out in situ, i.e., using a resistance-heating type heater in a sputtering device to form the cobalt layer 31 without transferring the substrate into a separate furnace. Also, the speed of forming the cobalt silicide thin film 33 is within a range of ten to several tens of angstroms Å per minute at a temperature of 300° C. regardless of the thickness of the coated cobalt layer 31, so that a process time for forming the cobalt silicide thin film 33 having a thickness of less than 200 Å can be decided by several to several tens of minutes depending on temperature conditions. Thus, because the thickness of the cobalt layer 31 to be formed is not limited to a certain range, the process condition can be modified. Accordingly, the thickness of the cobalt silicide thin film 33 can be controlled in a unit of 10 Å. At this time, the formed cobalt silicide thin film 33 is a low temperature type thin layer that has chemical formulas of $Co_2Si$ and $CoSi$.

Alternatively, the cobalt silicide thin film 33 can be formed by maintaining a temperature of a sputtering chamber at 200 to 500° C. while sputtering cobalt. At this time, a separate silicification treatment can be skipped. The thickness of the cobalt silicide layer 33 is controlled according to a sputtering time.

Also, when a Ti/Ti-nitride layer as a capping layer is formed by a CVD process after coating the cobalt layer, the cobalt silicide thin film 33 can be formed without a separate heat treatment. That is, because the CVD process is carried out at a process temperature of 300 to 700° C., the separate silicification process can be skipped.

Figure 5:
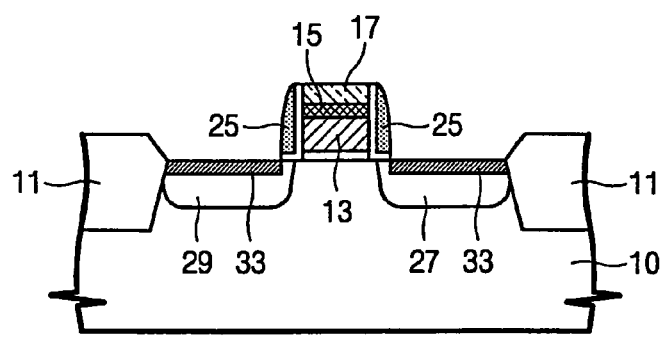

Referring to FIG. 5, non-reacted portions of the cobalt layer 31 are removed by wet etching from the substrate on which the cobalt silicide thin film 33 is formed by the low temperature heat treatment. Using wet etching is beneficial to remove the cobalt layer 31 because it has high etch selectivity and damages the substrate 10 very little. Consequently, only the cobalt silicide thin film 33 having a thickness of less than 200 Å remains on the surface of the substrate 10 in the source/drain regions 27, 29.

Figure 6:
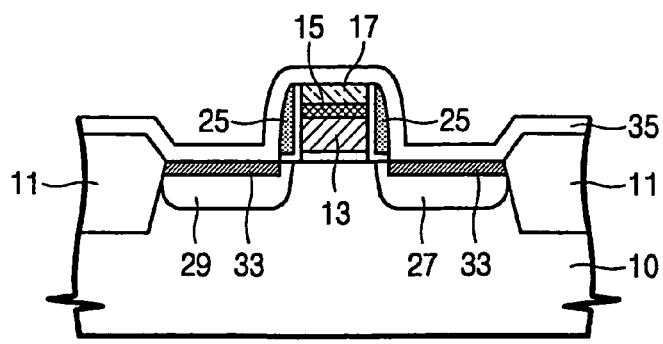

Referring to FIG. 6, a silicon oxynitride layer as a subsidiary layer 35 is formed to a thickness of several hundred angstroms Å on the substrate 10 in which the cobalt silicide layer 33 is formed.

Figure 7:
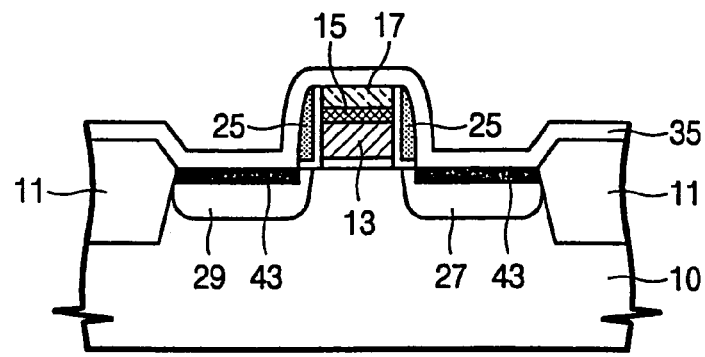

Referring to FIG. 7, a heat treatment is carried out at a high temperature of more than 700° C., for example 850° C. on the substrate 10 over which the subsidiary layer 35 is formed. As a result, the cobalt silicide layer 33 is transformed into a high temperature type cobalt silicide thin film 43 that has a chemical formula of $CoSi_2$, which enhances its conductivity.

Alternatively, after the non-reacted portions of the cobalt layer 31 are removed, a thin cobalt oxide layer (not shown) can be formed on a surface of the low temperature type cobalt silicide thin film 33. When the silicon oxynitride layer 35 is formed on the thin cobalt oxide layer and the high temperature heat treatment is carried out, the thin cobalt oxide layer provides oxygen to the silicon oxynitride layer 35 and becomes the cobalt silicide layer. Also, the silicon oxynitride layer 35 can limit a value of the contact interface resistance obtained through the high temperature heat treatment to a stable and narrow range. Accordingly, although the silicon oxynitride layer 35 has a low etch selectivity compared with the silicon nitride layer, but it can act as an etch stop layer while forming contact holes.

FIG. 8 through FIG. 11 are flow diagrams showing various stages of the processing for forming a semiconductor device in accordance with another embodiment of the present invention. In the second embodiment, duplicate explanations are omitted for brevity.

Figure 8:
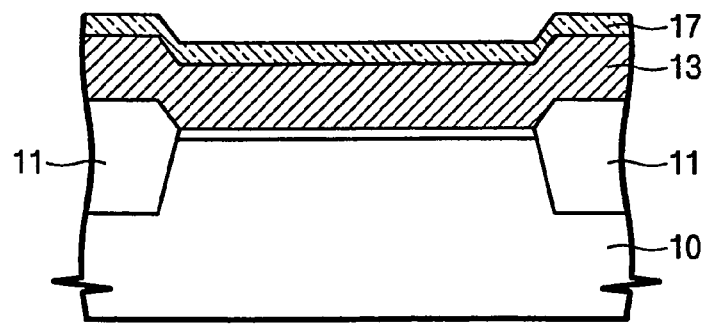
FIG. 8 to FIG. 11 are flow diagrams showing various stages of processing steps for forming a semiconductor device in accordance with another embodiment of the present invention.

Referring to FIG. 8, an isolation trench 11 is formed on a substrate 10 to define an active region. A gate insulation layer is then formed on the active region by thermal oxidation. A gate layer is formed by sequentially depositing a polysilicon layer 13 and a silicon oxynitride layer as an anti-reflection layer 17 by conventional techniques such as CVD.

Figure 9:
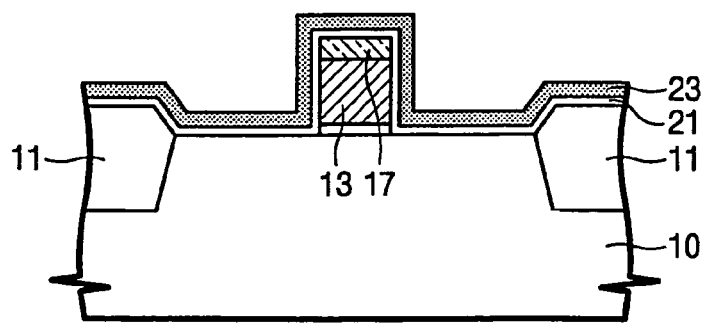

Referring to FIG. 9, the gate layer 13, 17 is patterned to form a gate pattern. To form spacers, a MTO layer 21 and a silicon nitride layer 23 are formed on the gate pattern using conventional techniques such as CVD.

Figure 10:
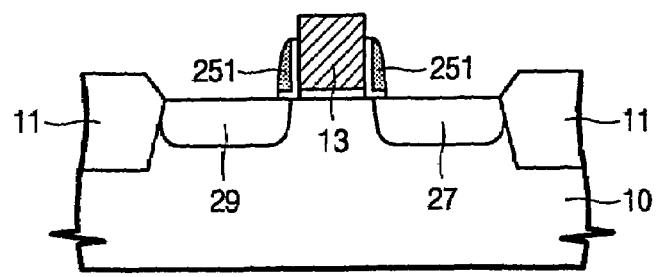

Referring to FIG. 10, the MTO layer 21 and the silicon nitride layer 23 are etched anisotropically. As a result, insulation spacers 251 are formed on sidewalls of the gate pattern. At this time, an inner layer of the insulation spacers 251 adjacent to the gate pattern is the MTO layer and an outer layer thereof is the silicon nitride layer. Also, the anisotropic etching for forming the spacers 251 is excessively carried out, i.e., over-etched. Accordingly, the anti-reflection layer 17 is removed and the height of the spacers 251 is reduced enough to expose an upper surface and upper portions of sidewalls of the gate pattern. Preferably, the sidewalls of the gate pattern are exposed as much as to a depth of 400 to 500 Å from the upper surface thereof.

Then, an ion implantation process is carried out using the gate pattern and the spacers 251 as a mask. Consequently, source/drain regions 27, 29 are formed.

Figure 11:
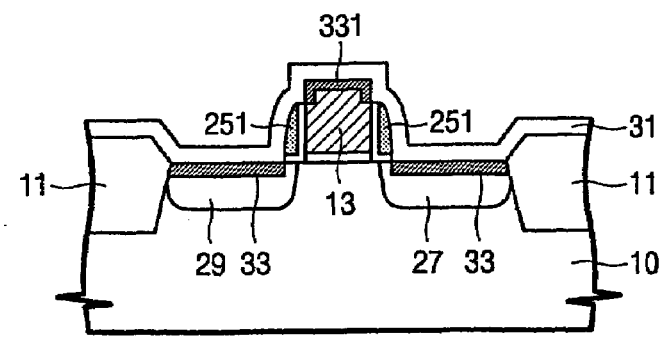

Referring to FIG. 11, a cobalt layer 31 is coated on the surface of the substrate 10 in which the source/drain regions 27, 29 are formed. A heat treatment is then carried out at a low temperature of 300° C.

Because the upper surface and the upper portions of the side walls of the gate pattern were exposed, a cobalt silicide thin film 331 covering an upper part of the gate pattern and the cobalt silicide thin film 33 covering the source/drain regions 27, 29 can be formed. Thus, without performing a separate process to form a metal silicide layer on the gate layer, the cobalt silicide thin film 331 can be formed during this process, thereby reducing the resistance of the gate line.

The cobalt silicide layer 33 of the source/drain regions 27, 29 is formed to a thickness of 50 to 150 Å. If the cobalt silicide layer 33 is too thin, the contact interface resistance and the resistance in the source/drain regions 27, 29 are increased, and if it is too thick, a spiking phenomenon is increased. Particularly, when the thickness of the cobalt silicide layer 33 is less than 150 Å, the leakage current through connecting surfaces is markedly reduced. At this time, since the polysilicon layer 13 of the gate layer has a structure different from a single crystalline silicon layer of the substrate 10, the cobalt silicide layer 331 forming the upper part of the gate pattern can be formed to a thickness of more than 200 Å. If the cobalt silicide layer 331 forms the upper part of the gate pattern, increasing the thickness of the cobalt silicide layer 331 is desirable because the resistance of the gate line and the delay of resistance capacitance (RC) can be reduced.

Figure 12:
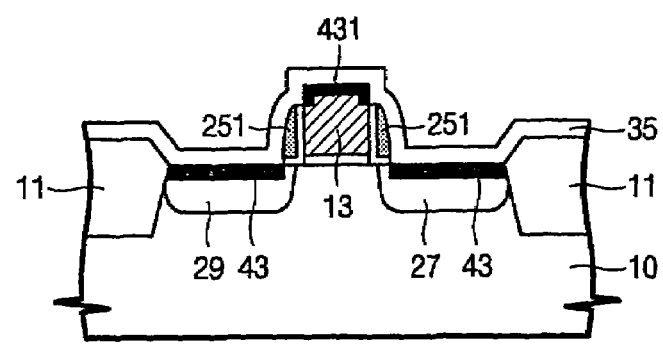

Referring to FIG. 12, non-reacted portions of the cobalt layer 31 are removed by wet etching from the substrate 10 over which the low temperature type cobalt silicide layers 33, 331 are formed by a low temperature heat treatment. A silicon oxynitride layer as a subsidiary layer 35 is then formed over the low temperature type cobalt silicide layers 33, 331. Next, a heat treatment is carried out at a high temperature of 850° C. to the substrate 10 over which the subsidiary layer 35 is formed. As a result, the cobalt silicide layers 33, 331 are transformed into high temperature type cobalt silicide thin films 43, 431, which have a chemical formula of $CoSi_2$ and a relatively high conductivity.

FIG. 13 through FIG. 19 are flow diagrams showing the various states of processing steps for forming a semiconductor device in accordance with yet another embodiment of the present invention.

Figure 13:
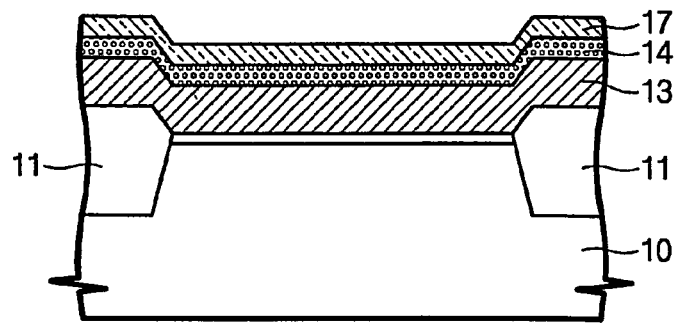
FIG. 13 to FIG. 19 are flow diagrams showing various stages of processing steps for forming a semiconductor device in accordance with yet another embodiment of the present invention.

Referring to FIG. 13, an isolation trench 11 is formed on a semiconductor substrate 10 to define an active region therein. A gate insulation layer is then formed on the active region by thermal oxidation. Then, a gate layer is formed by sequentially depositing a polysilicon layer 13, a silicon nitride layer 14 and a silicon oxynitride layer as an anti-reflection layer 17.

Figure 14:
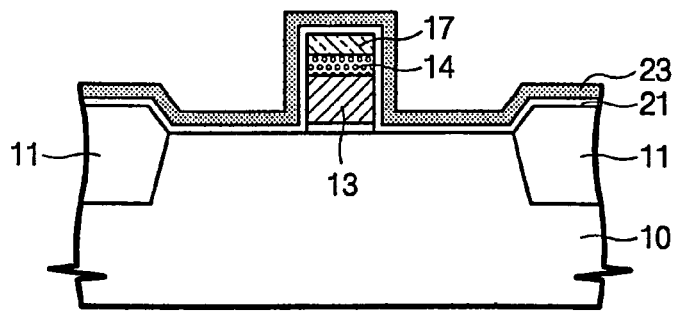

Referring to FIG. 14, the gate layer 13, 14,17 is patterned to form a gate pattern. To form spacers, a MTO layer 21 and a silicon nitride layer 23 are formed over the surface of the substrate 10 by CVD.

Figure 15:
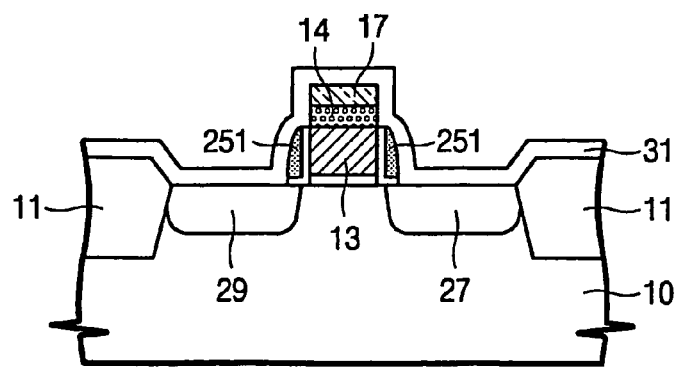

Referring to FIG. 15, the MTO layer 21 and the silicon nitride layer 23 are etched anisotropically. As a result, insulation spacers 251 are formed on sidewalls of the gate pattern. At this time, an anisotropic etching process to form the spacers 251 is excessively carried out in order to expose the polysilicon layer 13 of the gate pattern. Accordingly, the spacers 251 that expose an upper part of the gate pattern are formed. Then, an ion implantation process is carried out using the gate pattern and the spacers 251 as a mask. Consequently, source/drain regions 27, 29 are formed. Then, a cobalt layer 31 is coated on the source/drain regions 27, 29 by conventional techniques such as sputtering.

Figure 16:
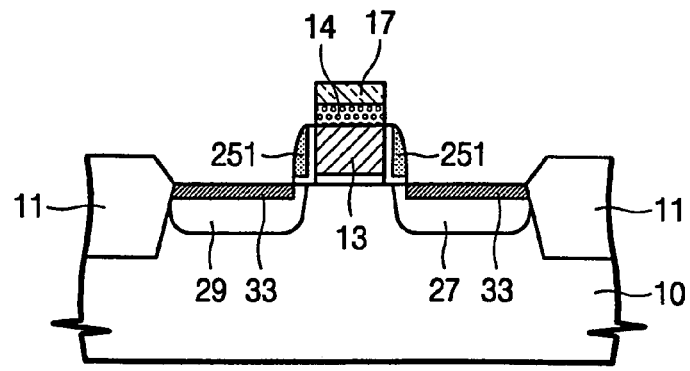

Referring to FIG. 16, a heat treatment is carried out at a low temperature of 300° C. to the substrate 10 over which the cobalt layer 31 is formed. As a result, a low temperature type cobalt silicide thin film 33 is formed in the source/drain regions 27, 29. Non-reacted portions of the cobalt layer 31 is then removed from the substrate 10 by wet etching.

Figure 17:
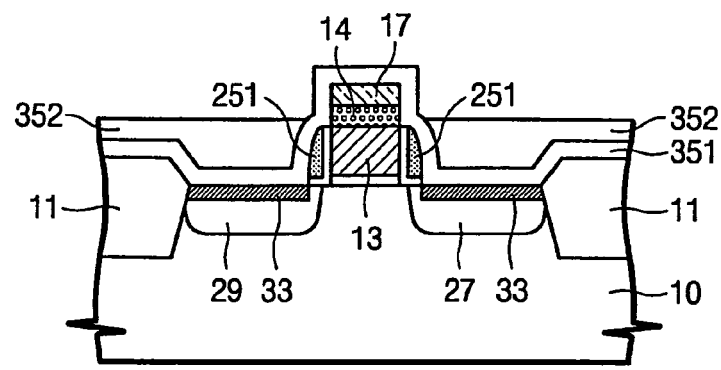

Referring to FIG. 17, a silicon nitride layer as an etch stop layer 351 is formed over the whole surface of the substrate 10 on which the low temperature type cobalt silicide layer 33 is formed. A silicon oxide layer as an interlayer insulation layer 352 is formed on the etch stop layer 351. The interlayer insulation layer 352 is then planarized using planarizing techniques such as chemical-mechanical polishing (CMP). An upper part of the gate pattern and the etch stop layer 351 may be exposed as shown. At this time, in a cell area of the semiconductor device in which the density of the gate line is high, the interlayer insulation layer 352 in the active region is lightly etched, while in a peripheral area of the semiconductor device in which the density of the gate line is low, it is widely and deeply etched. Accordingly, the interlayer insulation layer 352 remain thick in the cell area and thin in the peripheral area. Thus, steps may be formed between the cell and peripheral areas.

Figure 18:
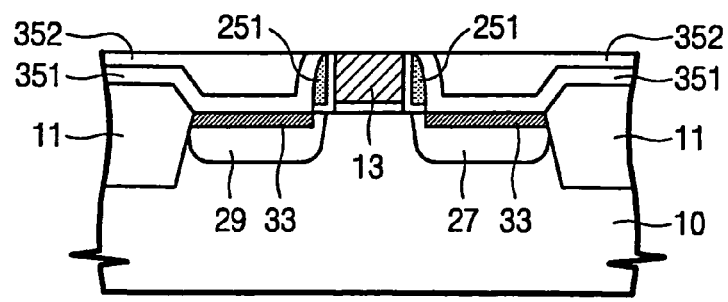

Referring to FIG. 18, the etch stop layer 351, the anti-reflection layer 17 and the silicon nitride layer 14 forming the upper part of the gate pattern, which project above the planarized interlayer insulation layer 352, are removed by etching, e.g., anisotropic etching until the polysilicon layer 13 is exposed. At this time, in the peripheral area that the interlayer insulation layer 352 thinly remains, the substrate 10 in the active region can be damaged due to the anisotropic etching. However, because the cobalt silicide layer was formed, the damage to the substrate 10 and increase in the resistance can be reduced by increasing the etch selectivity of the etch stop layer 351, the anti-reflection layer 17 and the silicon nitride layer 14 during the anisotropic etching. Also, the cobalt silicide layer 33 can decrease the contact interface resistance and the resistance in the source/drain regions 27, 29.

Figure 19:
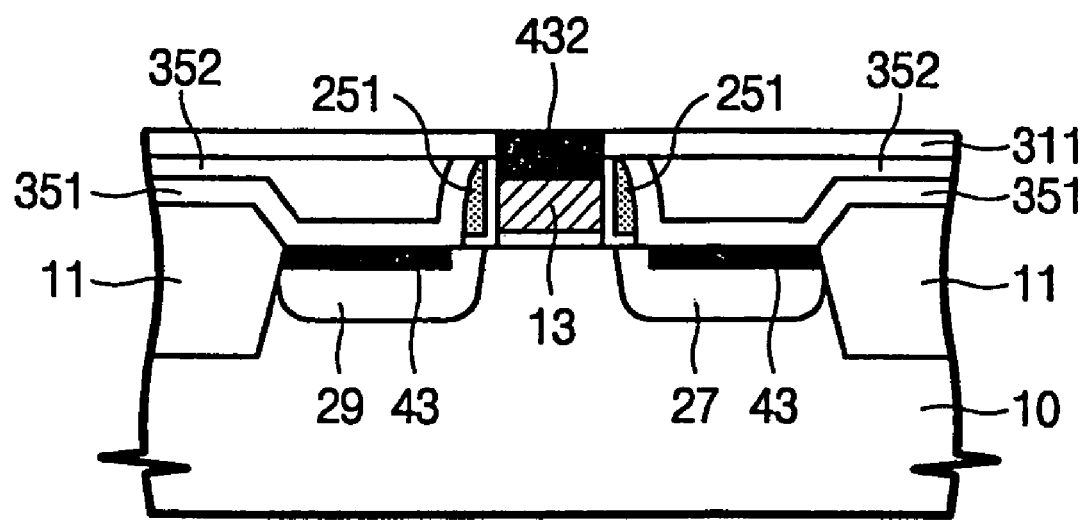

Referring to FIG. 19, a metal layer 311 such as a cobalt layer is formed on the polysilicon layer 13 of the gate pattern exposed by the anisotropic etching and then a heat treatment is carried out. At this time, the low temperature type cobalt silicide thin film 33 is transformed into a high temperature type cobalt silicide thin film 43 having a high conductivity by the high temperature heat treatment, and the thick metal silicide layer 432 is formed in the upper part of the polysilicon layer 13 of the gate pattern. Since there is no spiking problem, it is preferable to form a thick metal silicide layer 432.

Next, non-reacted portions of the metal layer are removed through the wet etching.

As apparent from the foregoing description, the invention can form the cobalt silicide thin film, the thick cobalt silicide layer or other metal silicide layer in the gate pattern depending on the applications. Also, with an embodiment of the invention, the cobalt silicide thin film of less than 200 Å can be formed in the source/drain region, which do not generate the spiking problem. Consequently, according to the invention, a semiconductor device that has superior properties and does not generate the process defect can be obtained.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A semiconductor device, comprising:
   a gate insulation layer on an active region of a semiconductor substrate;
   a gate electrode on the gate insulation layer;
   a lightly-doped source/drain region at both sides of the gate electrode in the active region;
   a first spacer on sidewalls of the gate electrode and on at least a portion of the lightly-doped source/drain regions, wherein the first spacer is L-shaped and comprises silicon oxide;
   a second spacer on the first spacer, wherein the second spacer comprises silicon nitride;
   a heavily-doped source/drain region at both sides of the gate electrode and adjacent to the second spacer;
   a cobalt silicide layer on the heavily-doped source/drain regions; and
   a subsidiary layer covering the cobalt silicide layer, the first spacer and the second spacer, wherein the subsidiary layer has a higher oxygen concentration in a lower portion of the subsidiary layer contacting the cobalt silicide layer than in another portion of the subsidiary layer not contacting the cobalt silicide layer.

2. The semiconductor device of claim 1, wherein the subsidiary layer comprises silicon oxynitride.

3. The semiconductor device of claim 1, further comprising an interlayer insulating layer disposed on the subsidiary layer.

4. The semiconductor device of claim 1, whereinfurther comprising a metal silicide layer on top of the gate electrode.

5. The semiconductor device of claim 4, wherein the metal silicide layer is thicker than the cobalt silicide layer.

6. The semiconductor device of claim 4, wherein the metal suicide layer does not contact the second spacer.

7. The semiconductor device of claim 1, wherein an uppermost surface of the cobalt silicide layer is disposed at a height lower than a bottom surface of the second spacer.

8. A semiconductor device, comprising:
   a gate insulation layer formed on a semiconductor substrate;
   a gate electrode formed on the gate insulation layer;
   source/drain regions formed in the semiconductor substrate, wherein the source/drain regions comprise a lightly-doped region and a heavily-doped region;
   a spacer formed on sidewalls of the gate electrode, wherein the spacer comprises an inner spacer and an outer spacer, wherein the inner spacer is adjacent to the gate electrode and comprises silicon oxide, wherein the outer spacer comprises silicon nitride and wherein the inner spacer has an L-shape;
   a cobalt silicide layer formed on the source/drain regions;
   a silicon oxynitride layer covering the cobalt suicide layer, the inner spacer and the outer spacer; and
   a metal silicide layer on top of the gate electrode, wherein the metal silicide layer does not contact the outer spacer.

9. The semiconductor device of claim 8, wherein a portion of the silicon oxynitride layer has a higher oxygen concentration in a portion contacting the cobalt suicide layer in comparison to a portion not contacting the cobalt suicide layer.

10. The semiconductor device of claim 8, wherein the metal silicide layer is thicker than the cobalt silicide layer.

11. The semiconductor device of claim 8, wherein an uppermost surface of the cobalt suicide layer is disposed at a height lower than a bottom surface of the outer spacer.

12. A semiconductor device, comprising:
   a gate insulation layer on an active region of a semiconductor substrate;
   a gate electrode on the gate insulation layer;
   source/drain regions within the active region, each of the regions extending outwardly from each side of the gate electrode, the source/drain regions each comprising a lightly doped region and a heavily doped region;
   a first spacer on both sides of the gate electrode and on at least a portion of the lightly doped region of the source/drain regions, wherein the first spacer is L-shaped;
   a second spacer being disposed on the first spacer;
   a cobalt silicide layer located on top of at least a portion of the heavily doped region of the source/drain regions, an uppermost surface of the cobalt silicide layer being disposed at a height lower than a bottom surface of the second spacer; and
   a subsidiary layer covering the cobalt silicide layer and the second spacer, wherein a portion of the subsidiary layer facing the cobalt silicide layer has a higher oxygen concentration than a portion of the subsidiary layer facing away from the cobalt suicide layer.

13. The semiconductor device of claim 12, further comprising a metal silicide layer on top of the gate electrode.

14. The semiconductor device of claim 13, wherein the metal silicide layer is thicker than the cobalt silicide layer.

15. The semiconductor device of claim 13, wherein the metal silicide layer does not contact the second spacer.

* * * * *

UNITED STATES PATENT AND TRADEMARK OFFICE
CERTIFICATE OF CORRECTION

| | | |
|---|---|---|
| PATENT NO. | : 7,385,260 B2 | Page 1 of 1 |
| APPLICATION NO. | : 10/830390 | |
| DATED | : June 10, 2008 | |
| INVENTOR(S) | : Hyung-Shin Kwon et al. | |

It is certified that error appears in the above-identified patent and that said Letters Patent is hereby corrected as shown below:

Column 7, line 64, the word "whereingfurther" should read -- further --;
Column 8, line 2, the word "suicide" should read -- silicide --;
Column 8, line 20, the word "suicide" should read -- silicide --;
Column 8, line 27, the word "suicide" should read -- silicide --;
Column 8, line 28, the word "suicide" should read -- silicide --;
Column 8, line 34, the word "suicide" should read -- silicide --;
Column 8, line 59, the word "suicide" should read -- silicide --;

Signed and Sealed this

Sixth Day of January, 2009

JON W. DUDAS
*Director of the United States Patent and Trademark Office*